United States Patent
Doric et al.

(10) Patent No.: US 10,527,256 B2
(45) Date of Patent: Jan. 7, 2020

(54) COMPACT HIGH-SPECTRAL-RADIANCE LIGHT SOURCE INCLUDING A PARABOLIC MIRROR AND PLANO-CONVEX FLUORESCENT BODY

(71) Applicant: Optomak, Inc., Quebec (CA)

(72) Inventors: Sead Doric, L'Ancienne-Lorette (CA); Jean-Luc Néron, Quebec (CA)

(73) Assignee: OPTOMAK, INC. (CA)

( * ) Notice: Subject to any disclaimer, the term of this patent is extended or adjusted under 35 U.S.C. 154(b) by 0 days.

(21) Appl. No.: 16/519,503

(22) Filed: Jul. 23, 2019

(65) Prior Publication Data
US 2019/0346112 A1 Nov. 14, 2019

Related U.S. Application Data

(60) Continuation-in-part of application No. 16/102,007, filed on Aug. 13, 2018, now Pat. No. 10,422,506, (Continued)

(51) Int. Cl.
*B60Q 1/26* (2006.01)
*F21V 7/06* (2006.01)
(Continued)

(52) U.S. Cl.
CPC .............. *F21V 7/06* (2013.01); *F21K 9/64* (2016.08); *F21V 5/04* (2013.01); *F21V 9/08* (2013.01);
(Continued)

(58) Field of Classification Search
CPC ..... F21K 9/62; F21K 9/64; F21V 5/04; F21V 7/06; F21V 9/08; F21V 29/76;
(Continued)

(56) References Cited

U.S. PATENT DOCUMENTS 6,834,064 B1 12/2004 Paschotta et al.
7,845,822 B2 12/2010 Bierhuizen
(Continued)

FOREIGN PATENT DOCUMENTS

DE 102012206644 A1 10/2013

OTHER PUBLICATIONS

International Search Report and Written Opinion in PCT/CA2019/051035, dated Sep. 19, 2019, 8 pages, (pp. 1-8 in pdf).
(Continued)

*Primary Examiner* — Jason M Han
(74) *Attorney, Agent, or Firm* — Mitch Harris, LLC; Andrew M. Harris

(57) ABSTRACT

A pumped fluorescent light source includes one or more mirrors that direct pumping light from one or more pump sources on a fluorescent body having a planar top surface and a convex back surface. The top surface may be coated with an anti-reflective coating and the back convex surface may be coated with a reflective coating to improve efficiency. The body top surface may also be roughened to scatter a portion of the excitation light provided from the mirror(s) to generate a white output beam. The mirror(s) have reflective surfaces disposed outside of a collection area of an output beam of the light sources, so that the collection area is not obstructed by the mirror(s). The light source also includes a collecting lens for collecting the light emitted by the body. The mirror may be a single parabolic mirror that focuses the excitation light on the body to stimulate emission.

22 Claims, 8 Drawing Sheets

Related U.S. Application Data which is a division of application No. 15/459,056, filed on Mar. 15, 2017, now Pat. No. 10,094,536.

(60) Provisional application No. 62/711,145, filed on Jul. 27, 2018.

(51) Int. Cl.

| | |
|---|---|
| *F21V 5/04* | (2006.01) |
| *F21K 9/64* | (2016.01) |
| *H01S 5/024* | (2006.01) |
| *H01S 5/022* | (2006.01) |
| *F21V 29/76* | (2015.01) |
| *H01S 5/40* | (2006.01) |
| *F21V 9/08* | (2018.01) |
| *F21Y 115/30* | (2016.01) |

(52) U.S. Cl.
CPC .......... *F21V 29/76* (2015.01); *H01S 5/02292* (2013.01); *H01S 5/02415* (2013.01); *H01S 5/02438* (2013.01); *H01S 5/4012* (2013.01); F21Y 2115/30 (2016.08); *H01S 5/02288* (2013.01); *H01S 5/02484* (2013.01)

(58) Field of Classification Search
CPC ............. F21Y 2115/30; H01S 5/02415; H01S 5/02484; H01S 5/40
USPC ...... 362/227–249.04, 311.02, 272, 326–327, 362/346, 554, 800
See application file for complete search history.

(56) References Cited

U.S. PATENT DOCUMENTS

| | | | |
|---|---|---|---|
| 7,898,665 | B2 | 3/2011 | Brukilacchio et al. |
| 8,625,097 | B2 | 1/2014 | Brukilacchio et al. |
| 8,804,246 | B2 | 8/2014 | Wolak |
| 8,929,413 | B2 | 1/2015 | Aubry et al. |
| 9,933,605 | B2 | 4/2018 | Rousseau et al. |
| 10,094,536 | B1 | 10/2018 | Rousseau et al. |
| 2009/0059359 | A1 | 3/2009 | Nahm et al. |
| 2012/0106178 | A1 | 5/2012 | Takahashi et al. |
| 2013/0058114 | A1 | 3/2013 | Reiners |
| 2014/0022512 | A1 | 1/2014 | Li et al. |
| 2017/0241631 | A1 | 8/2017 | Bessho |
| 2018/0115137 | A1 | 4/2018 | Sorg |
| 2019/0003679 | A1 | 1/2019 | Rousseau et al. |

OTHER PUBLICATIONS

Notice of Allowance in U.S. Appl. No. 15/459,056 dated Aug. 3, 2018, 11 pages (pp. 1-11 in pdf).

Office Action in U.S. Appl. No. 14/538,026 dated Aug. 15, 2017, 12 pages (pp. 1-12 in pdf).

Notice of Allowance in U.S. Appl. No. 14/538,026 dated Jan. 22, 2018, 8 pages (pp. 1-8 in pdf).

Denault, et al., "Efficient and stable laser-driven white lighting", AIP Advances 3, 072107, Jul. 2013, 7 pages (pp. 1-7 in pdf), AIP Publishing, NY, US.

"Product Sheet: EQ-99XFC LDLS Compact, Long-Life, High-Brightness, Broadband Laser-Driven Light Source with Fiber-Coupled Output", Energetiq Technology, Inc., downloaded from: http://www.energetiq.com/fiber-coupled-laser-driven-light-source-long-life-compact.php on Nov. 11, 2014, 2 pages (pp. 1-2 in pdf).

Liu, et al., "Spatially coherent white-light interferometer based on a point fluorescent source", Optics Letters, May 1993, pp. 678-680, vol. 18, No. 9, Optical Society of America, US.

"OSL2 High-Intensity Fiber Light Source: User Guide", Thorlabs, CTN002086-D02, Rev A, Jan. 15, 2014, 12 pages (pp. 1-12 in pdf), Thorlabs, Inc., Newton, NJ, US.

Tsai, et al., "Ce3+: YAG double-clad crystal-fiber-based optical coherence tomography on fish cornea", Optics Letters, Mar. 2010, pp. 811-813, vol. 35, No. 6, Optical Society of America, US.

Tuite, Don, "Blend Blue LEDS and Phosphors to Make HB LEDs", Electronic Design, May 2013, pp. 42-44, Penton Electronics Group, US.

Vatnik, et al., "Efficient thin-disk Tm-laser operation based on Tm:KLu(WO4)2/KLu(WO4)2 epitaxies", Optics Letters, Feb. 2012, pp. 356-358, vol. 37, No. 3, Optical Society of America, US.

"Product Sheet: WLS1000 Fibre-coupled White Light Source", Bentham Instruments Ltd., downloaded from: http://www.bentham.co.uk/wls100.htm on Oct. 1, 2014, 2 pages (pp. 1-2 in pdf).

"Advertisement: Broadband Fiber-Coupled Light Sources", Edmund Optics Inc., downloaded from http://www.edmundoptics.com/testing-targets/spectrometers/broadband-fiber-coupled-light-sources/3575 on Oct. 1, 2014.

Office Action in U.S. Appl. No. 16/102,007 dated Apr. 24, 2019, 11 pages (pp. 1-11 in pdf).

Notice of Allowance in U.S. Appl. No. 16/102,007 dated May 31, 2019, 8 pages (pp. 1-8 in pdf).

COMPACT HIGH-SPECTRAL-RADIANCE LIGHT SOURCE INCLUDING A PARABOLIC MIRROR AND PLANO-CONVEX FLUORESCENT BODY

This U.S. Patent Applications is a Continuation-in-part of U.S. patent application Ser. No. 16/102,007, filed on Aug. 13, 2018, published as U.S. Patent Application Publication No. 20190003679 on Jan. 3, 2019, and claims priority thereto under 35 U.S.C. § 120. U.S. patent application Ser. No. 16/102,007 is a Division of U.S. patent application Ser. No. 15/459,056, filed on Mar. 15, 2017, issued as U.S. Pat. No. 10,094,536 on Oct. 9, 2018, and claims priority thereto under 35 U.S.C. § 121. This U.S. Patent Applications further claims priority under 35 U.S.C. § 119(e) to U.S. Provisional Patent Application Ser. No. 62/711,145 filed on Jul. 27, 2018. The disclosures of the above-referenced U.S. Patent Applications and U.S. Provisional Patent Application are incorporated herein by reference.

BACKGROUND OF THE INVENTION

1. Field of the Invention

The present invention is related generally to optical sources, and in particular to a high-radiance fluorescent light source including a parabolic mirror directing excitation light to a plano-convex fluorescent body.

2. Background of the Invention

In biomedical applications, as well as other applications requiring stimulation of fluorescence or other similar illumination requirements, a broadband optical source is typically needed, as the speckle field generated by narrowband illumination makes narrowband illumination unsuitable for many biomedical and imaging applications, such as fluorescence imaging applications. Historical broadband incoherent light sources are relatively large optical systems and require large lenses and/or reflectors to produce an output beam with low divergence. The size of such optical systems limits the efficiency of coupling the output beam into a waveguide such as an optical fiber.

Present-day solid state broadband fluorescent light sources, such as the so-called "white LEDs" (light-emitting diodes), frequently employ LEDs to pump (optically stimulate) fluorescent materials such as fluorescent crystal powder embedded in epoxy resin or individual fluorescent crystals. While the use of LEDs as pumps reduces cost and size, the spectral radiance (W/Hz/m$^2$/sr) of these fluorescent light sources is limited by the radiance (W/m$^2$/sr) of the pump LED(s) within the absorption band of the fluorescent material, and thermal management of the heat transferred to the fluorescent material from the excitation. The use of low radiance optical pump sources such as LEDs leads to fluorescent light emission of low spectral radiance. Such low spectral radiance sources either provide poorly collimated light beams which are not suitable for long-range applications or poorly focused light beams which are not suitable for high-resolution applications and, in particular, for coupling in light guides such as liquid light guides and sub-mm core optical fibers.

In order to cool a fluorescent body in higher-radiance applications, front-surface or front-end pumping schemes may be employed. In such geometries, the output fluorescent light beam is on the same side as the input pump beams. These front-side pumping schemes often require pumping light sources (laser diodes, LEDs or other) as well as beam steering and focusing optics of these pump sources to be positioned on the front of the fluorescent material. Such an arrangement has several disadvantages. First, there are practical space limitations in positioning optical elements in front of the fluorescent body. The light-collecting optics of the output fluorescent light beam and further optical components such as: bandpass filters, beam combiners, fiber-coupling optics, etc. must then be located in front of the fluorescent body. Second, when the pump sources are located in front of the fluorescent body, the heat management of the device is complicated by the fact that each pump source generates its own heat load in addition to the pumped fluorescent material. The resulting arrangement requires the use of multiple heat sinks remotely located from each other, thus complicating the thermal interface of the resulting light source with a passive or active cooling system. Finally, the resulting light source requires assembly procedures that raise difficulties in high-volume manufacturing and optical alignment.

Therefore, it would be desirable to provide a light source with high spectral radiance, while maintaining a compact design and low manufacturing cost.

SUMMARY OF THE INVENTION

The above objectives of providing a low manufacturing cost and compact light source having high spectral radiance is provided in a light source and a method of operation of the light source.

The light source includes a body having a material doped to have a fluorescent property when stimulated at an excitation wavelength and a plano-convex shape, a collecting lens for collecting the light emitted by the body, one or more mirrors, and one or more light sources for providing excitation light at the excitation wavelength. The light sources have outputs directed at corresponding ones of the mirrors, so that the mirrors direct the excitation light provided by the one or more light sources at the body to stimulate emission of the light emitted by the body. The one or more mirrors have reflective surfaces disposed outside of a collection area of the output beam so that the collection area is not obstructed by the mirror(s). The one or more mirrors may be a single parabolic mirror positioned to have a focal axis directed at a top face of the body for focusing outputs of the light sources on the top face of the body.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATED EMBODIMENT

The present disclosure reveals light sources that provide high spectral radiance in a compact package that has improved manufacturability due to reduced component count. By including multiple pump light sources for stimulating a fluorescent body to emit a fluorescent light beam and gathering the pumping light with a parabolic mirror surface disposed outside of the output fluorescent light beam, the amount of light produced by the light source is increased, while providing better thermal management by locating the pump light sources behind the output of the light source. The fluorescent body has a plano-convex shape and the convex lower surface may be coated with a reflective coating. The planar top face of the body may be coated with an anti-reflective coating that facilitates the exit of the emitted fluorescence light, while not inhibiting the introduction of excitation light received from the parabolic mirror. The top face may be ground to roughen the top face to scatter some of the excitation light, which is generally in the blue wavelengths, in order to "whiten" the resulting output beam, since the fluorescent body generally emits "yellow" light, e.g., a mixture of wavelengths in the red and green wavelength ranges. The parabolic mirror may be circular in profile, or the profile may be annular, in order to provide an aperture for extracting the emitted output beam. The pump light sources can be coupled to the same thermal sink as the fluorescent body. The light source provides a systematic and simplified alignment procedure as well. By removing obstructions that would otherwise be located in front of the fluorescent body, a large collection solid angle is supported by a collector that forms the light source output beam. The configuration of the light sources illustrated herein also provides safer operation in case of failure since the direction of the pump beams are outside the solid angle of the output beam collecting optics. The optical alignment process of the illustrated light source also has reduced complexity that is suitable for automated optical alignment and assembly systems and therefore is suitable for high volume manufacturing. The resulting configuration provides efficient light collection of the output fluorescent light beam over a large solid angle, a compact packaging of pump light sources, fluorescent material and output light collecting optics, and a compact and simplified thermal management through a single planar hot surface located on the back of the light source opposite the output fluorescent light beam. The number of optical elements may also be reduced and the device geometry is compatible with compact hermetic packages similar to butterfly hermetic packages used in the telecommunication industry and, in particular, to high heat load (HHL) hermetic packages mostly used for high power laser diodes and quantum cascade lasers.

Figure 1A:
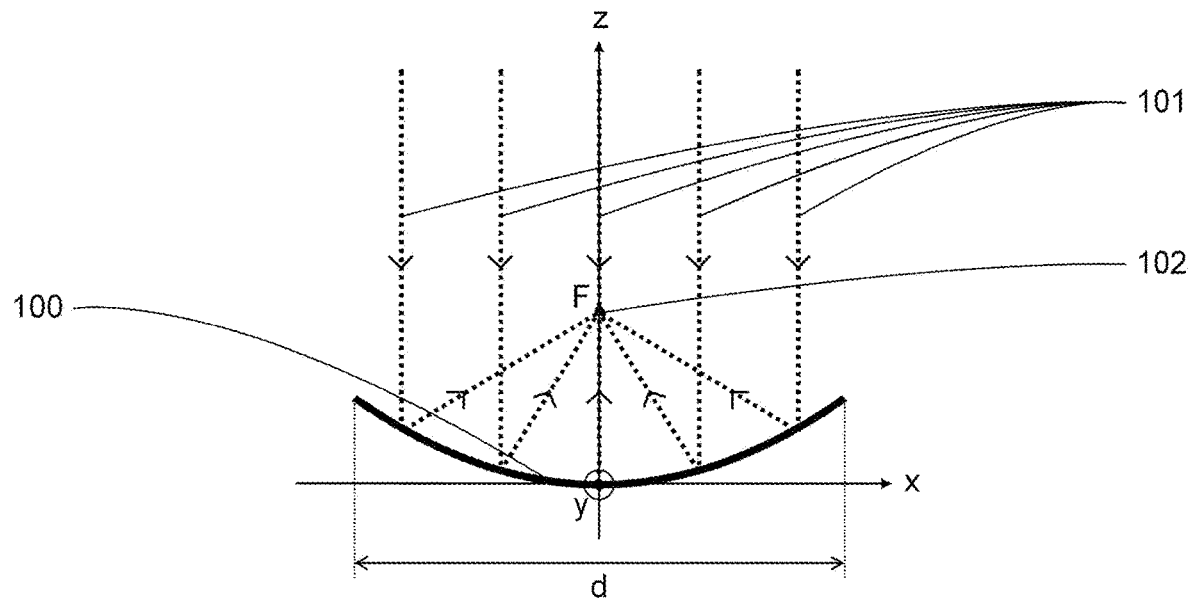
FIG. 1A and FIG. 1B are side cross-section views of an axisymmetric parabolic mirror as employed in various embodiments of the disclosure.
Figure 1B:
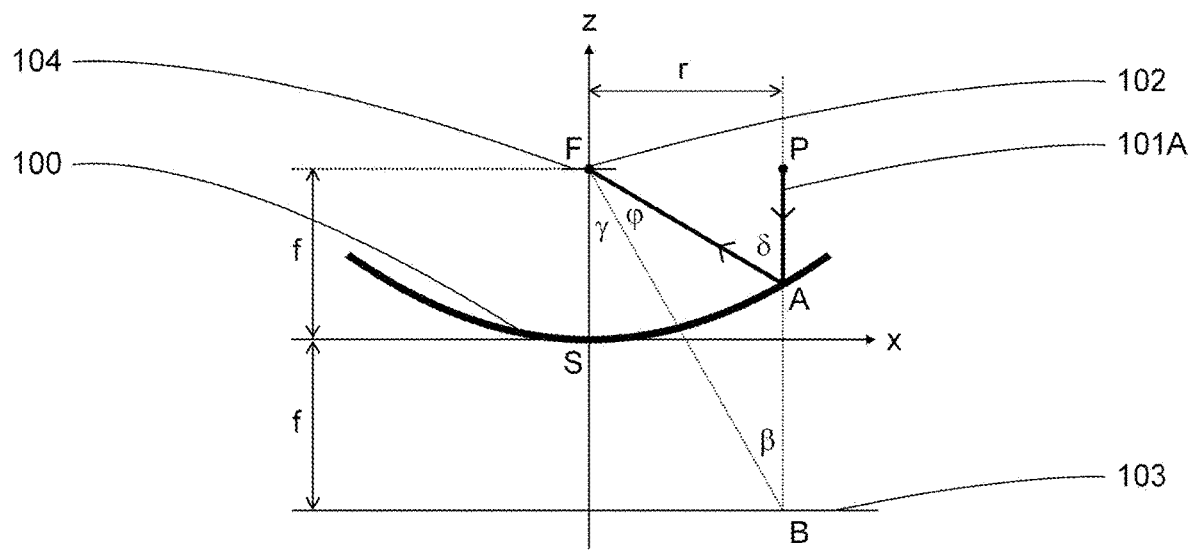

For the purpose of illustrating the operation of the various embodiments of light sources disclosed herein, an illustration of basic properties of parabolic mirrors is provided with reference to FIG. 1A and FIG. 1B. FIG. 1A shows a cross-section of an axisymmetric parabolic mirror having a reflective surface 100 described by the equation $z(x, y)=(x^2+y^2)/(4f)$ for any $(x, y)$ such that $(x^2+y^2) \le (d^2/4)$ where z is the position of the reflecting surface of the mirror, x and y are lateral positions expressed in Cartesian coordinates, d is the outer diameter of the parabolic mirror and parameter f is the focal length. Such a mirror reflects a collimated light beam parallel to the z axis or, equivalently, a bundle of incident light rays 101 arriving parallel to the z axis, at a focal point F 102 of the mirror located at coordinates $(x, y, z)=(0, 0, f)$. A parabolic mirror has two well-known advantages. First, there is no spherical aberration leading to a blurring of the focal spot even for a high numerical aperture (NA), that is, even for a large ratio d/f of the mirror diameter d over the focal length f. Second, like any purely reflective optical component, there is no chromatic aberration, which means that the properties of the mirror, and more specifically the focal length f, are independent of the wavelength within the reflectivity bandwidth of reflective surface 100. Consequently, the position of focal point F 102 is independent of the wavelength, which leads to a tight focus even for broadband light beams such as fluorescent light beams. The absence of chromatic aberrations also implies that a single parabolic mirror can be used for both the focusing of the pump light beams and the collimation of the broadband fluorescent light beam. The primary disadvantage associated with parabolic mirrors is difficulty of manufacture, due to a need for surface accuracy and quality (i.e., low surface roughness), since sub-micron accuracy is required to provide an adequate parabolic reflector in the visible spectrum, e.g., for wavelengths in the range of 400-700 nm. However, optical surface shaping technologies are now becoming more accessible and affordable, among which: computer numerical control (CNC) grinding and polishing, diamond turning, glass or plastic molding, and magneto-rheological surface finishing (MRF), which can be used to fabricate parabolic mirrors as employed in the embodiments of the light sources disclosed below.

Referring now to FIG. 1B, the principles of operation of a parabolic mirror as employed in the embodiments disclosed herein are further illustrated. An optical path of a light ray 101A originates from a pump source located at point P and is reflected by reflective surface 100 at point A. Light ray 101A is initially parallel to the z axis and located at coordinate x=r in a plane defined by coordinate y=0. A line located at coordinate z=−f is a directrix 103 of the parabola. It is known that a parabola is the locus of all points equidistant from focal point F 102 and directrix 103. Consequently, the lengths of segment AB extending between point A and point B, and segment AF extending between point A and focal point F 102 are equal. Triangle ABF is thus an isosceles triangle, with equal angles φ and β. Since segment AP extending between point A and point P is parallel to the z-axis, segment PB extending between point P and point B is also parallel to the axis z, requiring that that angles γ and β be equal as alternate internal angles. Therefore angle δ=∠SFA=γ+φ as alternate internal angles. Consequently, γ=φ=β and δ=2β. The angle of incidence $\theta_i$ of light ray 101A, e.g., a pump light ray, on a front surface 104 of a body having a fluorescent property that placed at plane z=f is angle ∠SFA where point S is the summit of a parabola located at the origin $(x, y, z)=(0, 0, 0)$ and A is the point of reflection of light ray 101A by reflective surface 100. By direct identification, angle $\theta_i=\angle SFA=\gamma+\varphi=2\beta$ and thus $r=2f \times \tan(\beta)$ and $r=2f \times \tan(\theta_i/2)$. Equation $r=2f \times \tan(\theta_i/2)$ linking r, f and $\theta_i$ is the basic design equation of parabolic mirrors used in the embodiments disclosed herein. The illustrated example is applicable to any pump source located at a distance r from the z-axis, since the illustrated parabolic mirror is axisymmetric. While the examples herein use axisymmetric parabolic mirrors to direct light from the pump sources to a fluorescent body, i.e., a material body having a fluorescent property, axisymmetric parabolic mirrors are not required, and other parabolic mirrors, such as a parabolic cylindrical mirror having a parabolic focus along a single axis, may be used in alternate embodiments. In another embodiment, a plurality of finite conjugate lenses and planar mirrors could be used to re-image the pump source outputs on the fluorescent body.

In the embodiments described below, multiple high-power laser pump beams are focused on the front surface of a body including a fluorescent material. In such arrangements, the pump power density can reach very high values leading to significant local heating of the body containing the fluorescent material. Such local heating can be a challenging environment in which to provide anti-reflective coatings on the front surface of the body. In order to minimize excitation light reflection loss and in order to maintain a compact assembly, an angle of incidence $\theta_i$ equal to the Brewster angle $\theta_B = \tan^{-1}(n)$, where n is the refractive index of the fluorescent material, may be provided to advantageously reduce reflection of the excitation light. For $\theta_i = \theta_B$, the Fresnel reflection at the front air-body interface is eliminated for p-polarized light beams (i.e., beams of light having their electric field parallel to the incidence plane). Since a laser diode output beam is generally TE-polarized with a polarization ratio on the order of 100:1, the Fresnel reflection of all pump beams can be essentially eliminated without employing an AR coating by orienting the junction plane of each pump laser diode along a radial axis, e.g., a junction oriented parallel to the x-axis for a pump laser diode located at point P as shown in FIG. 1B. As an example a Ce:YAG single crystal has a refractive index n=1.85 at a pump wavelength of 450 nm. Consequently, $\theta_B = \tan^{-1}(n) = 61.6°$ and the relationship between the radial position r of the pump source and the focal length f of the parabolic mirror becomes $r_B = 2f \times \tan(\theta_B/2) = 1.19 \times f$. In order to achieve a compact design, the value of $r_B$ can be set, for example, to 10 mm. The focal length of the parabolic mirror is then given by $f = r_B/1.19 = 8.39$ mm. Such a design is also compatible with fluorescent light collection over a very large NA, through an aperture provided through the center of the parabolic mirror. As a first approximation, the parabolic mirror center aperture diameter can approach $2r_B$, providing a numerical aperture that approaches $NA = \sin(\theta_B) = 0.871$. The above example illustrates an embodiment of the disclosure that is compatible with a Brewster angle front side pumping scheme while allowing collection of an emitted fluorescent light beam over a very large NA without obstructing the pump laser beams, although the example does not limit the possibilities of other arrangements that include the principles revealed by the disclosure, as recited in the Claims and equivalents thereof. Further, embodiments of the disclosure are not limited to Brewster angle pumping, and the pumping beams may be provided at a non-Brewster angle. In order to maximize the fluorescence emission, the embodiments disclosed herein may employ anti-reflective coatings to increase the emission from the fluorescent body. Providing such an anti-reflective coating at the emission wavelength affects the Brewster angle conditions described above for the excitation light, but thin film designs, which are generally stacks of material having different refractive indices may be specifically tuned to reduce internal re-reflection at the emission wavelengths over a specified angular range, while reducing the reflection at the external boundary of the body at the excitation wavelengths over another specified angular range.

Figure 2A:
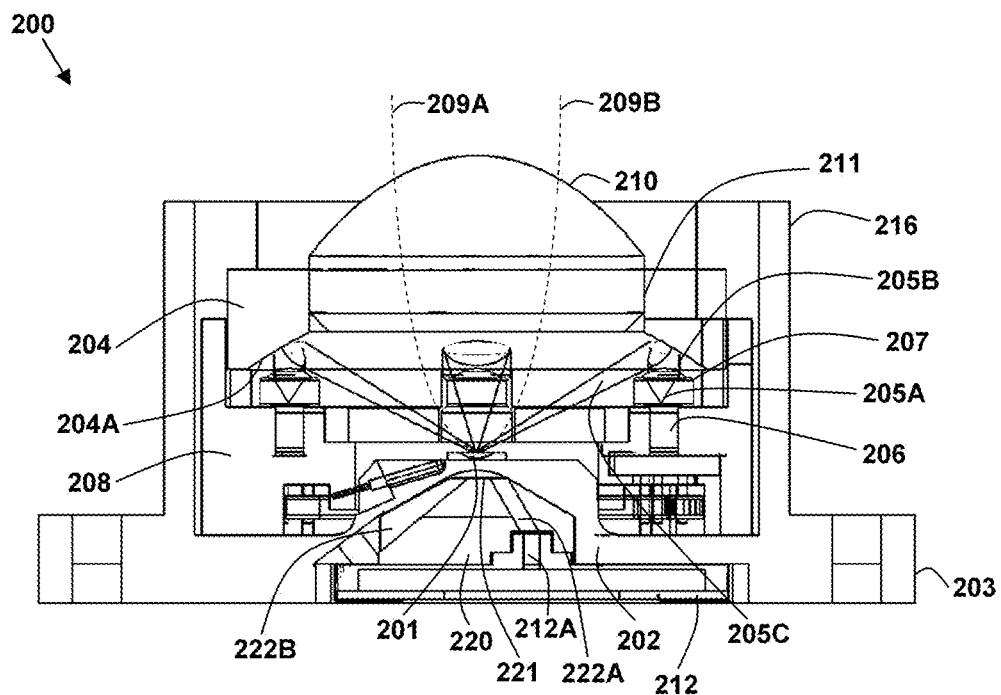
FIG. 2A is a side cross-section view.

Referring now to FIG. 2A, a side cross-section view of a light source 200 according to a first embodiment is shown. The illustrated example provides optical pumping of a plano-convex-shaped fluorescent body 201 of fluorescent material thermally and mechanically bonded to a heat spreader 202 positioned at a center of a mounting base 203 and having a profile matching the convex back (bottom) surface of fluorescent body 201. Heat spreader 202 and mounting base 203 are preferably made of a high thermal conductivity material such as copper, aluminum or a tungsten-copper (W—Cu) alloy. Heat spreader 202 can alternatively be formed as a stack of multiple materials to improve thermal management, including thermally conductive pastes and adhesives used to mount fluorescent body 201 within light source 200. Optical pumping is achieved via an annular parabolic mirror 204 that combines and focuses multiple pump beams provided by multiple pump laser diodes 206. Diverging pump beams 205A exiting from pump laser diodes 206, which in the example are provided in TO-can packages, are firstly collimated or nearly collimated using lenses 207 having an appropriate shape and focal length (e.g., high-NA aspherical molded glass lenses), a combination of fast-axis and slow-axis collimating lenses, or any single or multiple-element beam shaper suitable for providing substantially collimated beams. The resulting collimated or nearly collimated pump beams 205B are then redirected and focused on the front (top) face of fluorescent body 201 after reflection from a high-reflectivity coating 204A of annular parabolic mirror 204. Annular parabolic mirror 204 is secured by a mirror mount 208 over pump laser diodes 206 and lenses 207 and positioned such that the focal point of annular parabolic mirror 204 is located at the center of the front face of fluorescent body 201. Annular parabolic mirror 204 defines an aperture 211 for exit of an output beam 209A through a collimating lens 210 secured within aperture 211. Collimating lens 210 collimates output beam 209A to form a collimated output beam 209B. Each of the excitation beams provided by pump laser diodes 206 and lenses 207 are steered and focused so that pump beams 205C are combined on the center of the top face of fluorescent body 201. The front surface of fluorescent body 201 may be roughened to cause reflection of a portion of the light provided by pump beams 205C, so that the generally blue wavelengths provided by pump laser diodes 206 combines with the generally red-green wavelengths emitted by fluorescent body 201 in the optical output of light source 200 to yield a spectrum that is more white (broadband across the optical spectrum) rather than yellow (predominately red-green). The front surface of fluorescent body 201 may also be coated with an anti-reflective coating that is active at the emission wavelengths to increase the output efficiency of fluorescent body 201, while not disrupting Brewster-angle-directed pump beams 205C.

FIG. 2A also illustrates a particular embodiment of a thermal management subsystem implemented at the back side of fluorescent body 201. An air director 220 fits within a conical recess at the back side of heat spreader 202 that includes an inlet passage 222A and an outlet passage 222B, through which air supplied by an outlet port 212A of an electrically-operated fan 212 that is mounted in a recess in the back of a housing 216 beneath heat spreader 202. The air supplied by fan 212 is guided by inlet passage 222A through a cavity 221 that is proximate the back side of fluorescent body 201 and air is vented from outlet passage 222B through one or more ducts at the back face of housing 216 at a position where air vents are provided in any base to which light source 200 is mounted. The entirety of the illustrated thermal management subsystem including air director 220 and fan 212 lies outside of the hermetically-sealed portion of light source 200 so that the operation of the internal optical components of light source 200 is not compromised by the thermal management subsystem. Alternatively to the airflow based cooling illustrated in the Figures, liquid cooling can similarly be directed through inlet passage 222A and outlet passage 222B with appropriate external fittings, if required.

Figure 2B:
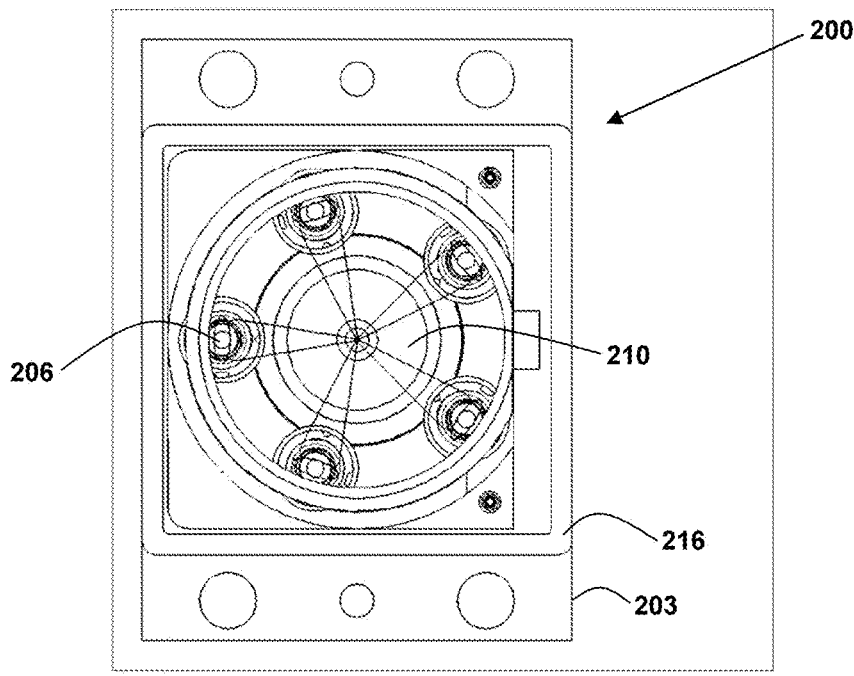
FIG. 2B is top cross-section view.

Referring additionally to FIG. 2B, a simplified top view of light source 200 of FIG. 2A is shown, in which the position of five pump laser diodes 206 arranged in a circle around fluorescent body 201 can be seen. Illustrated light source 200 includes multiple pump laser diodes 206 within housing 216 and distributed around the axis of symmetry of the system, however, asymmetric arrangements as well as arrangements all disposed to one side of fluorescent body 201 are also possible, with changes to annular parabolic mirror 204, which in some embodiments, do not require an aperture through annular parabolic mirror 204. All of the pump beams 205C, only three of which are illustrated in FIG. 2A as examples, are at least partially absorbed by the fluorescent body 201 which, in response to the excitation provided by pump beams 205A-205C, emits fluorescent output upon de-excitation of the doping element after an average fluorescence life time, e.g., approximately 70 ns for a Ce:YAG crystal used as fluorescent body 201. The fluorescence is generally emitted isotropically, that is, over a solid angle of $4\pi$ steradians. It is thus advantageous to provide a broadband high-reflectivity coating at the back convex surface of fluorescent body 201 or provide a highly-reflective top surface of heat spreader 202 that is optically bonded to fluorescent body 201, to reflect the fluorescent emissions that would otherwise not contribute to output beam 209A. Output beam 209A, which is diverging as it passes through aperture 211 extending through annular parabolic mirror 204, is generally subjected to further spatial or spectral beam shaping by additional optical elements or devices. In the example, aperture 211 is filled by collimating lens 210, which has a large numerical aperture (NA) and is designed to place the back focal point of collimating lens 210 at the pumped location of fluorescent body 201 to collect the fluorescent emission. Collimated output beam 209B is produced by collimating lens 210 to provide the output of the light source. The large-NA collimating lens 210 is preferably aspherical and achromatic to minimize the impact of spherical and chromatic aberrations on residual divergence of the collimated output beam 209B. Alternatively, in each of the embodiments depicted herein, the collimating device, e.g., collimating lens 210 may be provided by an on-axis or off-axis parabolic mirror, a Fresnel lens, or any other refracting, reflecting or diffractive optical device. While collimating lens 210 is located within the aperture 211, in order to reduce package size, such co-location is not a requirement and a collimating device may be positioned above or underneath annular parabolic mirror 204 to collect and collimate the light that exits through the large aperture provided through annular parabolic mirror 204, as long as the focal point of the collimating device is coincident with the pumped location of fluorescent body 201.

In a particular embodiment employing Brewster angle laser diode pumping, the junctions of each of pump laser diodes 206 are arranged in a radial direction, i.e., the junctions are aligned perpendicular to the circular arrangement depicted, in order to obtain the required p-polarized beams at the surface of fluorescent body 201. As mentioned above, it is advantageous to put a high-reflectivity (HR) broadband coating on the back surface of fluorescent body 201, or to optically bond fluorescent body 201 to heat spreader 202, which can be highly-polished to reflect the emitted fluorescence light towards the optical output, i.e., toward collecting and collimating lens 210. It is also preferable to extend the bandwidth of the HR coating to the pump wavelength in order to double the optical path length (OPL) of each pump beam inside the fluorescent material. The doubling of the optical path length of the pump beam allows using a fluorescent material of lower absorption coefficient $\mu_\alpha$ or, for a given value of $\mu_\alpha$, to use a thinner fluorescent material, thus improving the heat load removal from fluorescent body 201 by reduction of the maximum thickness of fluorescent body 201. For instance, Ce:YAG crystal materials with absorption coefficient $\mu_\alpha=60.0$ cm$^{-1}$ are available. Further, reflection of the pump beams at the HR coating prevents the pump beams from degrading the material (e.g., solder or adhesive) used to bond fluorescent body 201 to heat spreader 202, thus increasing the reliability of light source 200.

Figure 2C:
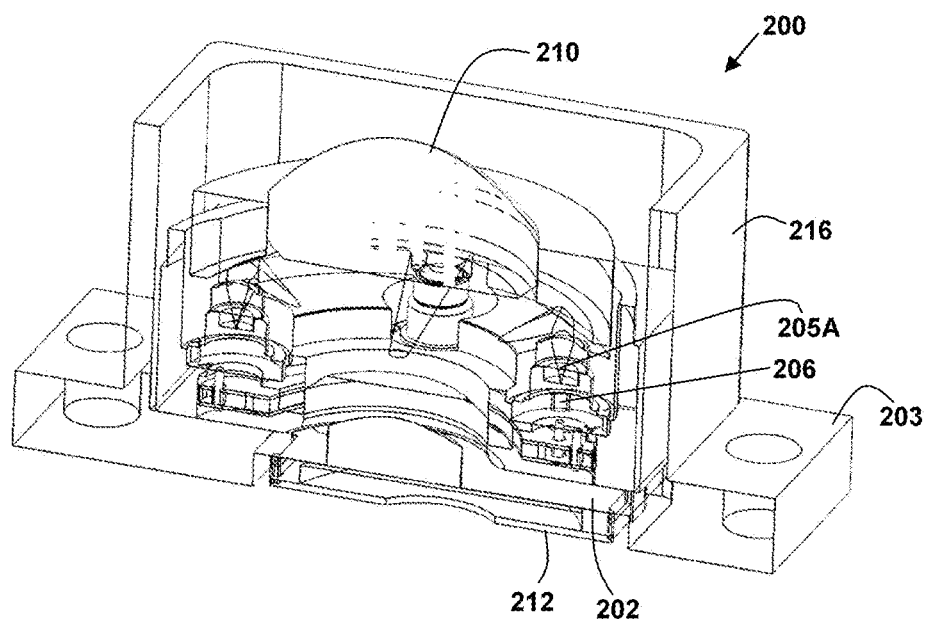
FIG. 2C is a perspective cross-section view.
Figure 2D:
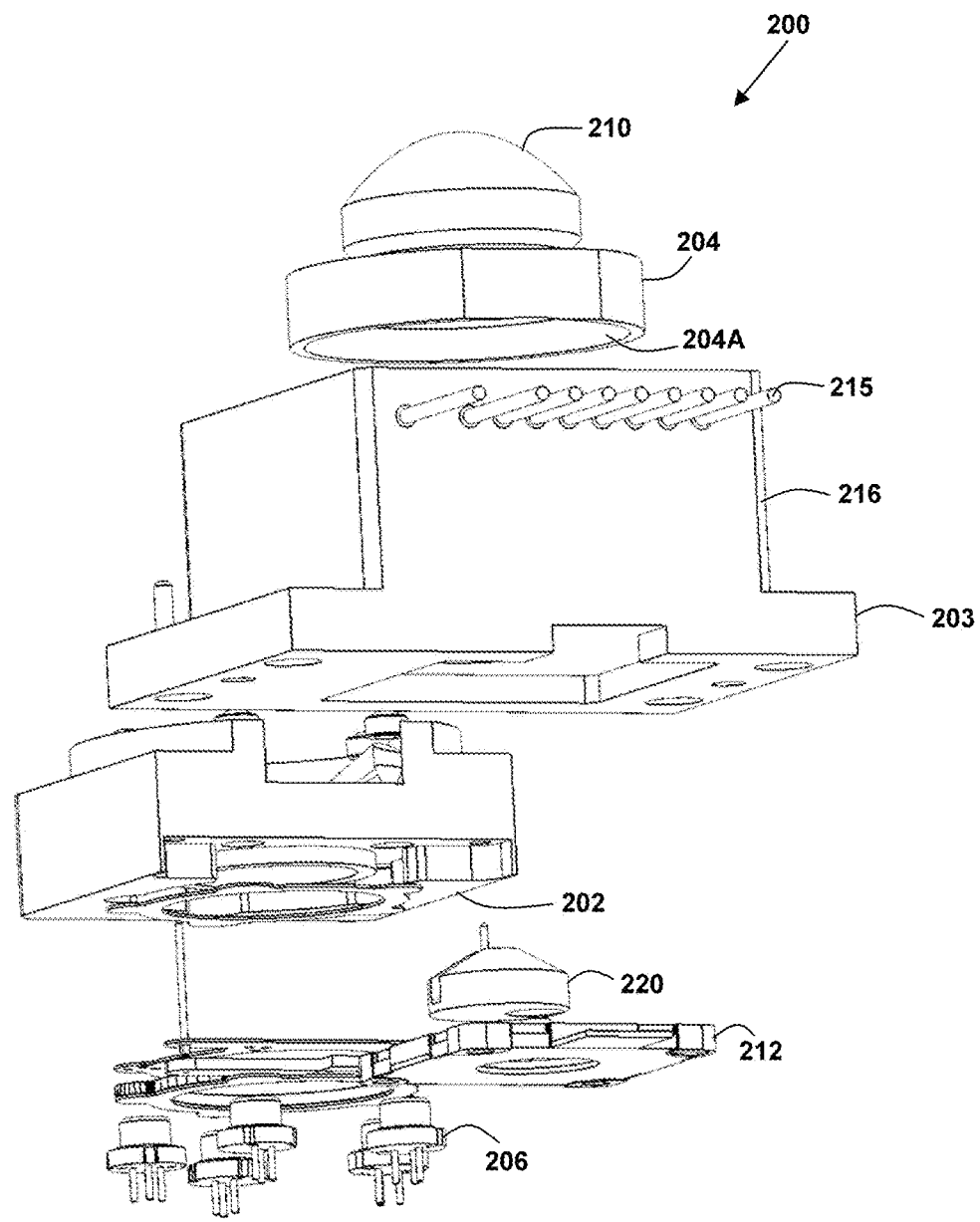
FIG. 2D is an exploded view and FIG. 2E is a perspective view of a light source 200 according to an embodiment of the disclosure.

FIG. 2C shows a perspective cross-section view of light source 200 in which the position of fan 212 underneath heat spreader 202 is visible and the location of pump laser diodes 206 and pump beams 205A can be seen in further detail. FIG. 2D shows an exploded view of light source 200, with the individual components, including pump laser diodes 206, fan 212, air director 220 heat spreader 202, housing 216 with integral mounting base 203, along with a plurality of hermetic electrical feedthroughs 215 provided through housing 216. Annular parabolic mirror 204 is shown with the location of high-reflectivity coating 204A visible and collimating lens 210 is also illustrated.

Figure 2E:
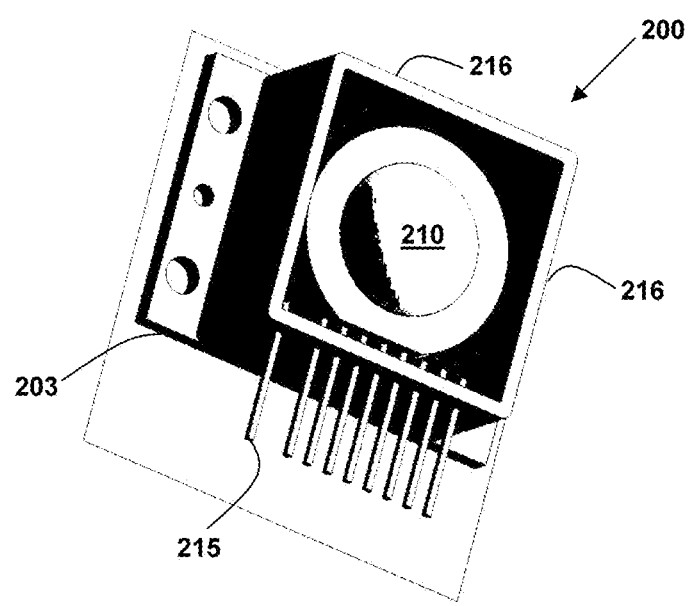

As mentioned above, heat spreader 202 can be fabricated from a single material or a stack of materials having properly chosen thermal properties, the most important properties of each material being the thermal conductivity κ (expressed in W/m/K) and the linear coefficient of thermal expansion α (often expressed in ppm/K). If the active cooling system illustrated in FIGS. 2A-2E is employed, air director 220 may also be selected. The choice of material(s) aims to favor the cooling of the fluorescent material by using high thermal conductivity materials while avoiding mechanical stresses, and, in particular, warpage (thermally induced curvature) of the fluorescent body 201 and heat spreader 202 assembly from a large mismatch of their respective coefficients of thermal expansion (CTEs). Thus, the heat spreader in some embodiments is implemented using a stack of different materials, such as stacks including very high thermal conductivity plates such as CVD (chemical vapor deposited) diamond plates (κ>1800 W/m/K). Fluorescent body 201 and heat spreader 202 can be bonded using, for instance: adhesives (optical, thermal, thermally conductive, etc.), soldering techniques, surface contact techniques, bonding techniques (diffusion bonding) or mechanical clamping with or without thermal interface materials (TIMs), such as thermally conductive pastes. Heat spreader 202 and mounting base 203 can be fabricated from a contiguous thermally-conductive material as shown, or heat spreader 202 and mounting base 203 may be thermally isolated. Heat spreader 202 and/or the mounting base 203 can be cooled passively or actively. In an alternative thermal management scheme, passive cooling can be achieved by a thermal conductive path between heat spreader 202 and mounting base 203, which can be thermally coupled using a TIM such as: a thermally conductive paste, a thermally conductive adhesive, a thermal pad, etc. Active cooling of light source 200 can be provided via air jets, liquid jets directed at the back side of mounting base 203 or a liquid loop cooler thermally bonded to a back surface of mounting base 203. One or more cavities for air or liquid flow can be formed in mounting base 203 and extending to or near the back face of fluorescent body 201 in order to optimize heat transfer away from fluorescent body 201. Light source 200 is protected from environmental dust and humidity by packaging including mounting base 203, housing 216, and the external (convex) face of collimating lens 210, which may be hermetically sealed. Electrical connections may be made through hermetic electrical feedthroughs 215 on one of the side walls of housing 216. A mechanical connection having high thermal conductivity may be provided at the flat surface at the bottom of mounting base 203 for passive removal of heat from light source 200, which is generally achieved by providing an external heat sink to which mounting base 203 is mounted, preferably using a TIM layer to reduce the thermal resistance of the interface. Alternatively, the air or liquid cooling arrangements described above for air or liquid cooling directly to mounting base 203 or through channels extending near the back face of fluorescent body 201 may be employed. In addition, a "passive" cooler may be actively cooled using forced convection or conduction (e.g.: fans, air jets or circulating liquid cooling systems, etc.). FIG. 2E shows a completed packaged light source 200 in a perspective view.

Figure 3:
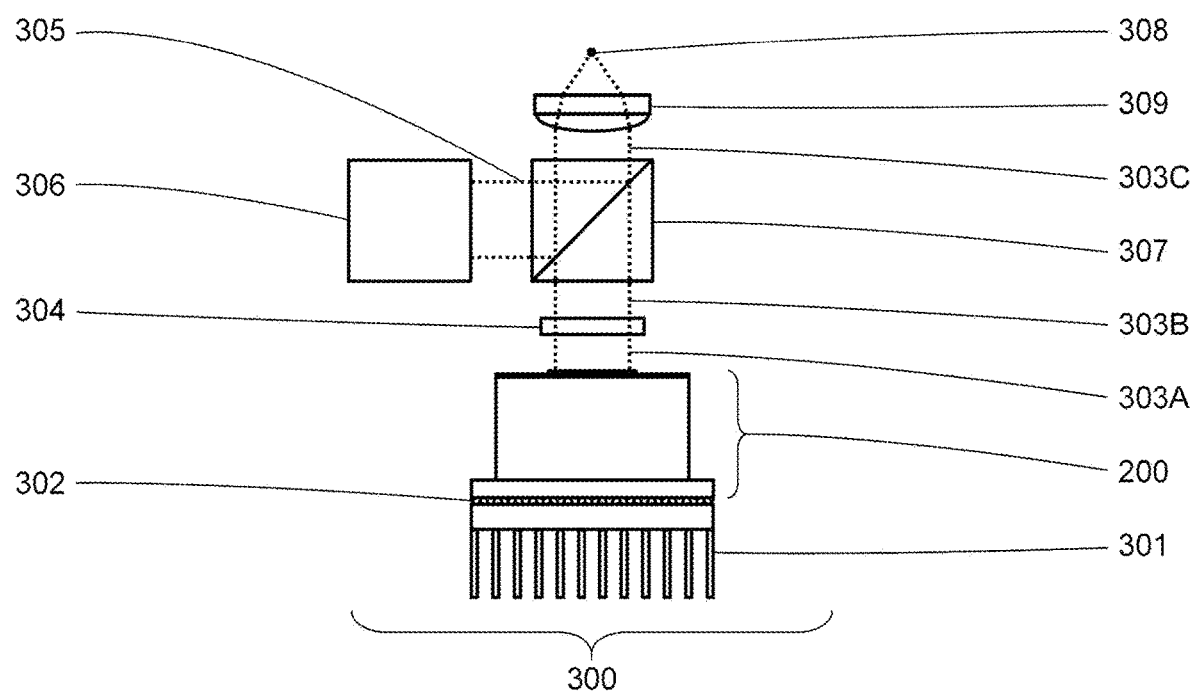
FIG. 3 is a simplified schematic view of light source 200 of FIGS. 2A-2E and including an alternative thermal management subsystem.

Referring now to FIG. 3, a simplified schematic of an optical light source 300 is shown in accordance with another embodiment of the disclosure. The disclosed optical light source 300 may be implemented to provide a broader bandwidth or multi-wavelength optical output than the above-illustrated embodiment shown in FIGS. 2A-2E. In an alternative thermal management configuration, light source 200 is mounted to a heat sink 301 using a TIM layer 302. An output collimated fluorescent light beam 303A is filtered with an optical filter 304 such as a bandpass or a colored glass filter. A resulting collimated beam 303B is combined with a collimated beam 305 of a secondary light source 306 such as a laser, an LED or any other light emitting device, such as another fluorescent light source similar to light source 200. A beam combiner 307, such as a dichroic beam combiner cube combines the light from light source 200 and secondary light source 306. Additional secondary light sources and beam combiners (not illustrated) can be added along the path of collimated beam 303B. A final combined collimated beam 303C can be used directly or focused on a spot 308 using a focusing lens 309. In applications requiring fiber coupling, the input tip of an optical fiber (not shown) can be precisely positioned on the focal spot 308 in order to maximize the fiber-coupled output power. Alternatively, in each of the exemplary embodiments disclosed herein, the focusing device, e.g., focusing lens 309 may be provided by a parabolic mirror, a Fresnel lens, or any other refracting, reflecting or diffractive optical element. The focusing device generates an image of the pumped location of fluorescent body 201 at a focal point. The input tip of a light guide, e.g., an optical fiber face, can be made coincident with the image location, i.e., an image plane of the pumped location of fluorescent body 201, in order to couple the output beam of light source 200 to another device/location.

Figure 4:
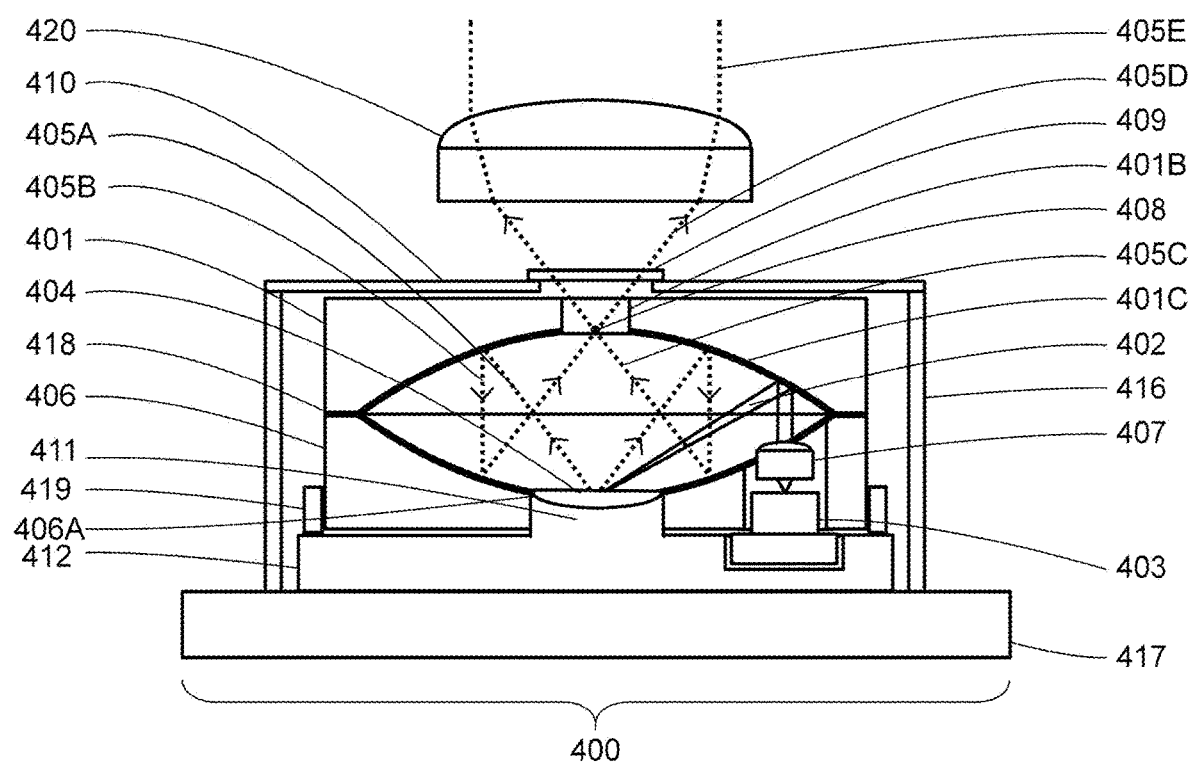
FIG. 4 is a side cross-section view of a light source according to another embodiment of the disclosure.

Referring now to FIG. 4, a light source 400 in accordance with another embodiment of the disclosure is shown. Light source 400 is similar to light source 200, but includes a second (bottom) parabolic mirror 406 that provides for shifting the apparent position of the source, i.e., a fluorescent body 404, to a position near an output window 409 of the package, which enables locating a collimating lens 420 that collects and collimates the output fluorescence light outside the package to produce a collimated light beam 405E. Light source 400 also allows a direct optical fiber coupling at the top cover of the package similar to that described below with reference to the embodiment depicted in FIG. 5. A top parabolic mirror 401 and bottom parabolic mirror 406 are arranged to face each other. Top parabolic mirror 401 serves two purposes. As in light source 200 of FIGS. 2A-2E, top parabolic mirror 401 focuses a pump beam 402 of each pump laser diode 403 onto fluorescent body 404 formed with a fluorescent material. In contrast to light source 200 of FIGS. 2A-2E, top parabolic mirror 401 has a very small central aperture 401B and an optical coating 401C that reflects, in addition to the pump beam wavelength, the entire bandwidth (or the selected sub-band) of the light emitted by the fluorescent body 404. The second purpose of top parabolic mirror 401 is to collimate a divergent fluorescent light beam 405A. A reflected fluorescent light beam 405B is collimated and directed toward bottom parabolic mirror 406. Bottom parabolic mirror 406 has a small aperture 406A provided by a central hole in which the fluorescent body 404 is located. In particular, fluorescent body 404 is located where the summit of the bottom parabolic mirror 406 would be located if small aperture 406A were not present. Small central aperture 401B will generally have a diameter less than 20% of the diameter of the guiding circle, which is not specifically shown in FIG. 4, but is at the midpoint of the circle of pump beams 402 at their incidence on top parabolic mirror 401, as exemplified by guiding circle 204B of FIG. 2B. The diameter of small aperture 406A provided in bottom parabolic mirror 406 is generally equal to the diameter of small central aperture 401B. For example, the diameter of small central aperture 401B and small aperture 406A may be 10% of the diameter of the guiding circle. Bottom parabolic mirror 406 includes additional holes 406B through which each of pump beams 402 is directed. For clarity, only one pump laser diode 403 and a corresponding collimating lens 407 and small aperture 406A are shown. In practice, multiple pump laser diodes 403 are distributed around the central axis of the system in an arrangement similar to that shown in FIG. 2B.

Fluorescent light beam 405B is reflected by the bottom parabolic mirror 406, resulting in a beam 405C focused toward a focal point 408. The pumped volume of fluorescent body 404 is imaged by the bottom parabolic mirror 406 at the focal point 408 of bottom parabolic mirror 406. The image provides a source of an output divergent fluorescent light beam 405D transmitted through an AR coated hermetically sealed output window 409 at a center of a top cover 410 of the hermetic package. As mentioned above, a broadband HR coating behind fluorescent material 404 redirects the backward fluorescence back through fluorescent body 404 to combine in output divergent fluorescent light beam 405A. Fluorescent body 404 is mechanically and thermally coupled to a heat spreader 411 that supports fluorescent body 404 at the center of a pump laser diode holder 412. The thermal management of the fluorescent material 404 is similar to the operation of heat spreader 202 of FIGS. 2A-2E and may be cooled in the same manner. The hermetic package is completed by side walls 416 and a thermally conductive base 417, which is coupled to a heat sink as in the light source shown in FIG. 3, or otherwise directly cooled. In light source 400 of FIG. 4, top parabolic mirror 401 and bottom parabolic mirror 406 are secured together using an optical UV-cured adhesive at an interface 418. The resulting dual-mirror assembly is mounted atop pump laser diode holder 412 by a ring metal spacer 419 and suitable adhesive material.

In example light source 400, top parabolic mirror 401 and bottom parabolic mirror 406 have equal focal lengths that image fluorescent body 404 with a magnification M=1 and the focal point of each of parabolic mirrors 401, 406 coincides with the summit of the opposite parabolic mirror. The optical coating of top parabolic mirror 401 has two purposes: to efficiently reflect the high power density pump laser beams (at least in their respective areas) and to efficiently reflect the fluorescence emitted by fluorescent body 404 over a large solid angle and an appropriate optical bandwidth. Bottom parabolic mirror 406 is generally only used for focusing the fluorescent emissions from fluorescent body 404. Consequently, the optical coating on bottom parabolic mirror 406 may be optimized to reflect light only in the bandwidth of the fluorescent emission. Embodiments of light source 400 are not restricted to the depicted construction of the mirror assembly. For example, other embodiments consistent with the operation of light source 400 may include a single bi-convex lens coated on either side with the proper coating on each side to provide top parabolic mirror 401 and bottom parabolic mirror 406.

Figure 5:
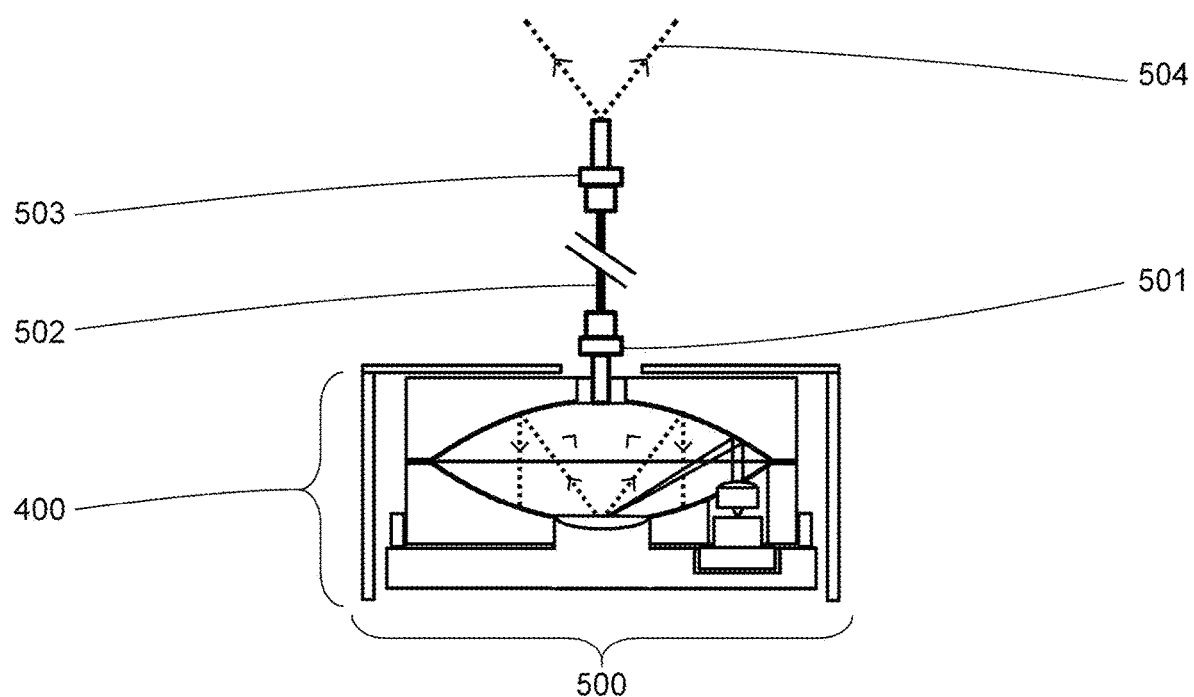
FIG. 5 is a side cross-section view of a light source according to yet another embodiment of the disclosure.

Referring now to FIG. 5, a light source 500 in accordance with another embodiment of the disclosure is shown. The depicted embodiment is similar to light source 400 of FIG. 4 (with the exception of window 409 and collimating lens 420) and is particularly suited for compact optical fiber coupling of the output fluorescent light beam. An input connector 501 tip of an optical fiber 502 is precision-aligned at focal point 408 of bottom parabolic mirror 406 shown in FIG. 4. The fluorescent light beam is then guided into and through optical fiber 502 until the fluorescent light exits an output connector 503 of optical fiber 502 and then freely diverges as an output fluorescent light beam 504.

While the invention has been particularly shown and described with reference to the preferred embodiment thereof, it will be understood by those skilled in the art that the foregoing and other changes in form, and details may be made therein without departing from the spirit and scope of the invention.

What is claimed:

1. A light source, comprising:
   a body having a planar top surface and a convex back surface formed from a material doped to have a fluorescent property when stimulated at an excitation wavelength, so that the body emits light in an emission band;
   a collimating device for collecting at least a portion of the light emitted by the body over a collection area to generate a collimated output beam;
   one or more mirrors positioned to have a focal axis directed at the body and having reflective surfaces disposed outside of the collection area so that the collection area is not obstructed by the one or more mirrors; and
   one or more light sources for providing excitation light at the excitation wavelength and having a corresponding one or more outputs directed at the one or more mirrors along one or more corresponding optical paths, so that the one or more mirrors direct substantially all of the excitation light provided by the one or more light sources at the body to stimulate emission of the light emitted by the body.

2. The light source of claim 1, wherein the one or more mirrors consists of a parabolic mirror positioned to have a focal axis directed at the body, and wherein the one or more outputs of the one or more light sources have outputs directed at the parabolic mirror along one or more corresponding optical paths having a direction parallel to the focal axis of the parabolic mirror, so that the parabolic mirror focuses substantially all of the excitation light provided by the one or more light sources at the body to stimulate emission of the light emitted by the body.

3. The light source of claim 2, wherein the parabolic mirror includes a central aperture passing therethrough for admitting the portion of the light emitted by the body, and wherein the collimating device is positioned at the central aperture of the parabolic mirror to collect the at least a portion of the light emitted by the body.

4. The light source of claim 3, wherein the parabolic mirror is a first parabolic mirror with a small central aperture and wherein the light source further comprises a second parabolic mirror positioned to reflect light emitted from the body that is incident at the first parabolic mirror outside of the aperture and that is directed toward the second parabolic mirror to increase a portion of the light emitted by the fluorescent body that exits the small central aperture of the first parabolic mirror and is collected by the collimating device.

5. The light source of claim 4, wherein the second parabolic mirror focuses an image of the body at an image plane and wherein the light source further comprises an optical waveguide having an input surface positioned at the image plane to receive the image of the body generated by the second parabolic mirror.

6. The light source of claim 1, wherein the planar top surface of the body is roughened to scatter a portion of the excitation light, so that the portion of the excitation light is combined with the light emitted by the body.

7. The light source of claim 1, wherein the planar top surface of the body is coated with an anti-reflective coating that is anti-reflective in the emission band for incidence angles less than a Brewster angle and anti-reflective in the excitation band at incidence angles at and around the Brewster angle.

8. The light source of claim 1, wherein the one or more light sources are multiple light sources positioned in a circular arrangement around the body outside of a projection of the central aperture toward the body.

9. The light source of claim 1, wherein the one or more light sources and the corresponding one or more mirrors are positioned so that the excitation light is incident on the fluorescent body at an angle substantially equal to the Brewster angle, wherein the one or more light sources emit the excitation light with a transverse polarization, and wherein the one or more light sources have a rotational alignment such that the excitation light is p-polarized at incidence on the fluorescent body.

10. The light source of claim 1, further comprising a heat spreader thermally and mechanically coupled to the convex back surface of the fluorescent body for removing heat from the body.

11. The light source of claim 10, wherein the one or more light sources are one or more laser diodes, and wherein a substrate of each of the one or more laser diodes are mechanically and thermally bonded to the heat spreader.

12. A light source, comprising:
   a body having a planar top surface and a convex back surface formed from a material doped to have a fluorescent property when stimulated at an excitation wavelength, so that the body emits light in an emission band, wherein the planar top surface of the body is coated with an anti-reflective coating that is anti-reflective in the emission band;

a collimating device for collecting and collimating at least a portion of the light emitted by the body over a collection area;

a parabolic mirror positioned to have a focal axis directed at the body and having reflective surfaces disposed outside of the collection area provided by a central aperture through the parabolic mirror so that the collection area is not obstructed by the parabolic mirror;

multiple laser diodes for providing excitation light at the excitation wavelength and positioned in a circular arrangement around the body outside of a projection of the central aperture toward the body, wherein the multiple laser diodes each have an output directed at the parabolic mirror, so that the parabolic mirror focuses substantially all of the excitation light provided by the multiple laser diodes at the body to stimulate emission of the light emitted by the body, wherein the multiple laser diodes and the parabolic mirror are positioned so that the excitation light is incident at the parabolic mirror at an angle substantially equal to the Brewster angle, and wherein the one or more laser diodes have junction planes oriented parallel to a plane of reflection of the excitation light at the parabolic mirror, wherein the planar top surface of the body is roughened to scatter a portion of the excitation light, so that the portion of the excitation light is combined with the light emitted by the body; and a heat spreader thermally and mechanically coupled to the body for removing heat from the body, and wherein a substrate of each of the one or more laser diodes are mechanically and thermally bonded to the heatsink.

13. A method of generating light, comprising:
providing a body having a planar top surface and a convex back surface and formed from a material doped to have a fluorescent property when stimulated at an excitation wavelength;

stimulating the body with one or more light sources that produce a corresponding one or more excitation beams having a wavelength substantially equal to the excitation wavelength, wherein the one or more excitation beams are directed at the body with corresponding one or more mirrors to cause the body to emit light in an emission band; and collecting and collimating at least a portion of the light emitted by the body by a collimating device to produce a collimated output beam.

14. The method of claim 13, wherein the one or more mirrors is a parabolic mirror having a focal axis directed at the body, and wherein outputs of the one or more light sources have outputs directed at the parabolic mirror along one or more corresponding optical paths having a direction parallel to the focal axis of the parabolic mirror, so that the parabolic mirror focuses substantially all of the excitation light provided by the one or more light sources at the body.

15. The method of claim 14, wherein the parabolic mirror includes a central aperture passing therethrough for admitting the portion of the light emitted by the body, and wherein the collecting is performed by the collimating device positioned to collect the at least a portion of the light emitted by the body at the central aperture of the parabolic mirror.

16. The method of claim 15, wherein the parabolic mirror is a first parabolic mirror and wherein the method further comprises reflecting light emitted from the body that is incident at the first parabolic mirror outside of the aperture and that is directed toward a second parabolic mirror to increase the portion of the light emitted by the body that is collected by the collecting lens with the second parabolic mirror.

17. The method of claim 16, further comprising:
the second parabolic mirror focusing an image of the body at an image plane; and
receiving image of the body generated by the second parabolic mirror with an optical waveguide having an input surface positioned at the image plane.

18. The method of claim 13, wherein the planar top surface of the body is roughened to scatter a portion of the excitation light, so that the portion of the excitation light is combined with the light emitted by the body.

19. The method of claim 13, wherein the planar top surface of the body is coated with an anti-reflective coating that is anti-reflective in the emission band for incidence angles less than a Brewster angle and anti-reflective in the excitation band at incidence angles at and around the Brewster angle.

20. The method of claim 13, wherein the one or more light sources are multiple light sources positioned in a circular arrangement around the body outside of a projection of the central aperture toward the body.

21. The method of claim 13, further comprising:
positioning the one or more light sources and the corresponding one or more mirrors so that the excitation light is incident on the fluorescent body at an angle substantially equal to the Brewster angle, wherein the one or more light sources emit the excitation light with a transverse polarization; and
aligning the one or more light sources rotationally such that the excitation light is p-polarized at incidence on the one or more mirrors.

22. The method of claim 13, further comprising providing a heat spreader thermally and mechanically coupled to the convex back surface of the body for removing heat from the body.

* * * * *